US011722110B2

(12) United States Patent
Yoneda et al.

(10) Patent No.: US 11,722,110 B2
(45) Date of Patent: Aug. 8, 2023

(54) SIGNAL PROCESSING DEVICE, SIGNAL PROCESSING METHOD, PROGRAM, AND VIDEO DISPLAY DEVICE

(71) Applicant: Sony Group Corporation, Tokyo (JP)

(72) Inventors: Michiaki Yoneda, Kanagawa (JP); Yoshiyuki Kuroda, Chiba (JP)

(73) Assignee: Sony Group Corporation, Tokyo (JP)

( * ) Notice: Subject to any disclaimer, the term of this patent is extended or adjusted under 35 U.S.C. 154(b) by 11 days.

(21) Appl. No.: 17/604,365

(22) PCT Filed: Mar. 30, 2020

(86) PCT No.: PCT/JP2020/014599
§ 371 (c)(1),
(2) Date: Oct. 15, 2021

(87) PCT Pub. No.: WO2020/217872
PCT Pub. Date: Oct. 29, 2020

(65) Prior Publication Data
US 2022/0182030 A1 Jun. 9, 2022

(30) Foreign Application Priority Data
Apr. 23, 2019 (JP) ................................. 2019-081749

(51) Int. Cl.
*H03G 3/30* (2006.01)
*H04R 1/02* (2006.01)
(Continued)

(52) U.S. Cl.
CPC ........... *H03G 3/3005* (2013.01); *H04R 1/028* (2013.01); *H04R 5/02* (2013.01); *H04R 5/04* (2013.01);
(Continued)

(58) Field of Classification Search
CPC ............................ H04R 29/001; H04R 3/007; H04R 2227/005; H04R 29/007; H04R 1/028;
(Continued)

(56) References Cited

U.S. PATENT DOCUMENTS 6,009,181 A * 12/1999 Kim ..................... H03G 3/3005
381/26
11,249,716 B2 * 2/2022 Ahn ........................ H04R 7/10
(Continued)

FOREIGN PATENT DOCUMENTS

| JP | 2005-012618 A | 1/2005 |
| JP | 2014-039232 A | 2/2014 |
| WO | WO 2018/123310 A1 | 7/2018 |

OTHER PUBLICATIONS

International Search Report and English translation thereof dated Jun. 16, 2020 in connection with International Application No. PCT/JP2020/014599.

*Primary Examiner* — Xu Mei
(74) *Attorney, Agent, or Firm* — Wolf, Greenfield & Sacks, P.C.

(57) ABSTRACT

A signal processing device includes a first panel displacement control unit to which a first audio signal is input, a second panel displacement control unit to which a second audio signal is input, and a control unit configured to control the first panel displacement control unit and the second panel displacement control unit. The first panel displacement control unit includes a first gain adjustment unit configured to adjust a level of the first audio signal, the second panel displacement control unit includes a second gain adjustment unit configured to adjust a level of the second audio signal, and the control unit includes a correlation determination unit configured to determine presence or absence of a correlation between the first audio signal and the second audio signal, and a gain control unit configured (Continued)

to control a level adjustment amount in each of the first gain adjustment unit and the second gain adjustment unit on the basis of a determination result of the correlation determination unit.

12 Claims, 14 Drawing Sheets

(51) Int. Cl.
  *H04R 5/02* (2006.01)
  *H04R 5/04* (2006.01)
  *H04R 29/00* (2006.01)
  *H04S 1/00* (2006.01)
(52) U.S. Cl.
  CPC ........... *H04R 29/001* (2013.01); *H04S 1/007* (2013.01); *H03G 2201/103* (2013.01); *H04R 2430/01* (2013.01); *H04R 2499/15* (2013.01); *H04S 2400/13* (2013.01)

(58) Field of Classification Search
  CPC ........ H04R 5/02; H04R 5/04; H04R 2430/01; H04R 2499/15; G01K 1/14; G01K 3/10; H03G 3/3005; H03G 2201/708; H04N 21/42202; H04N 21/4398; H04N 21/4424; H04S 2400/13; H04S 1/007
  USPC ............ 381/306, 333, 388, 1, 104, 107, 109
  See application file for complete search history.

(56) References Cited

U.S. PATENT DOCUMENTS

| | | | |
|---|---|---|---|
| 2013/0016858 A1* | 1/2013 | Masaki | H04N 21/41265 381/104 |
| 2014/0241558 A1* | 8/2014 | Yliaho | H04R 5/02 381/333 |
| 2022/0225042 A1* | 7/2022 | Kuroda | H04R 29/001 |

* cited by examiner

FIG. 3
A
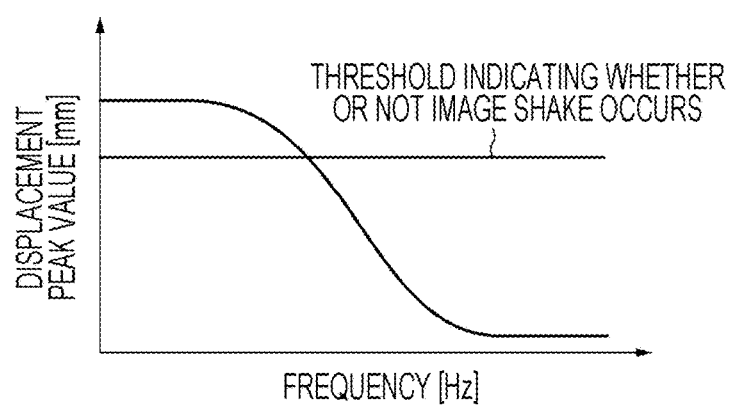
B
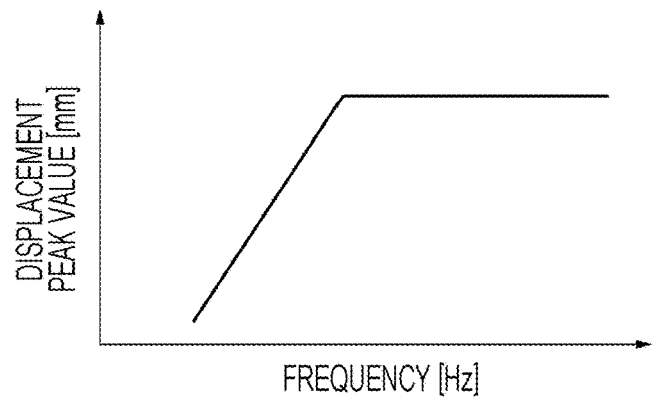
C
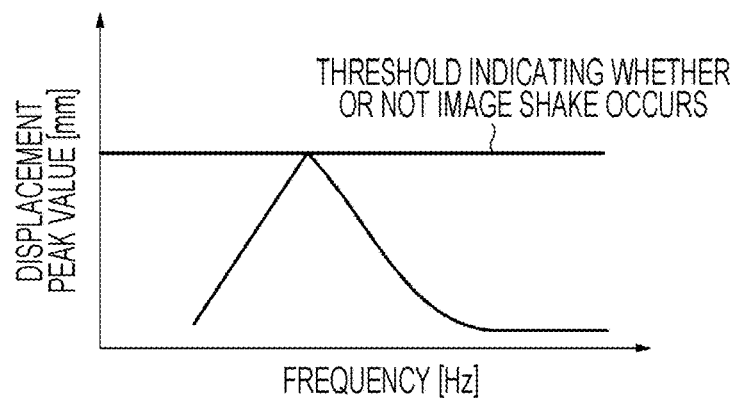

FIG. 13
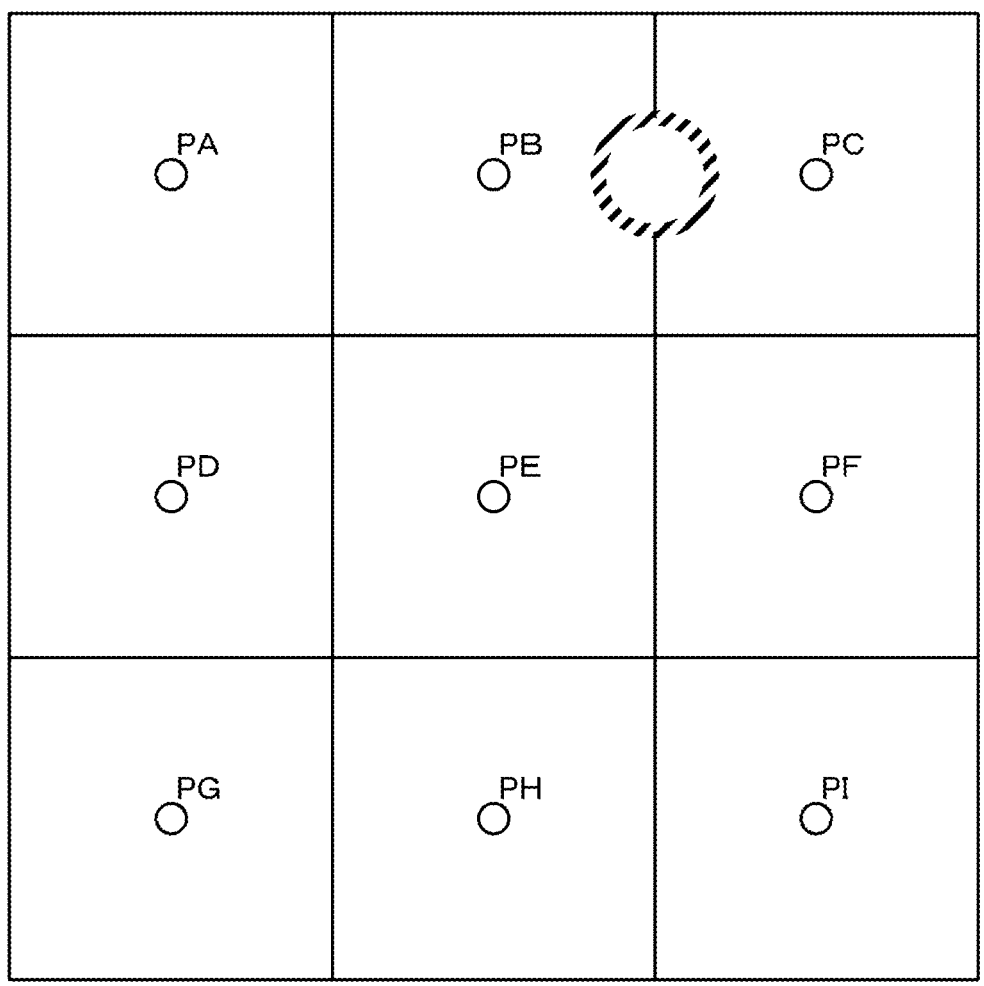
 IMAGINARY IMAGE OF SOUND IMAGE LOCALIZATION

FIG. 14
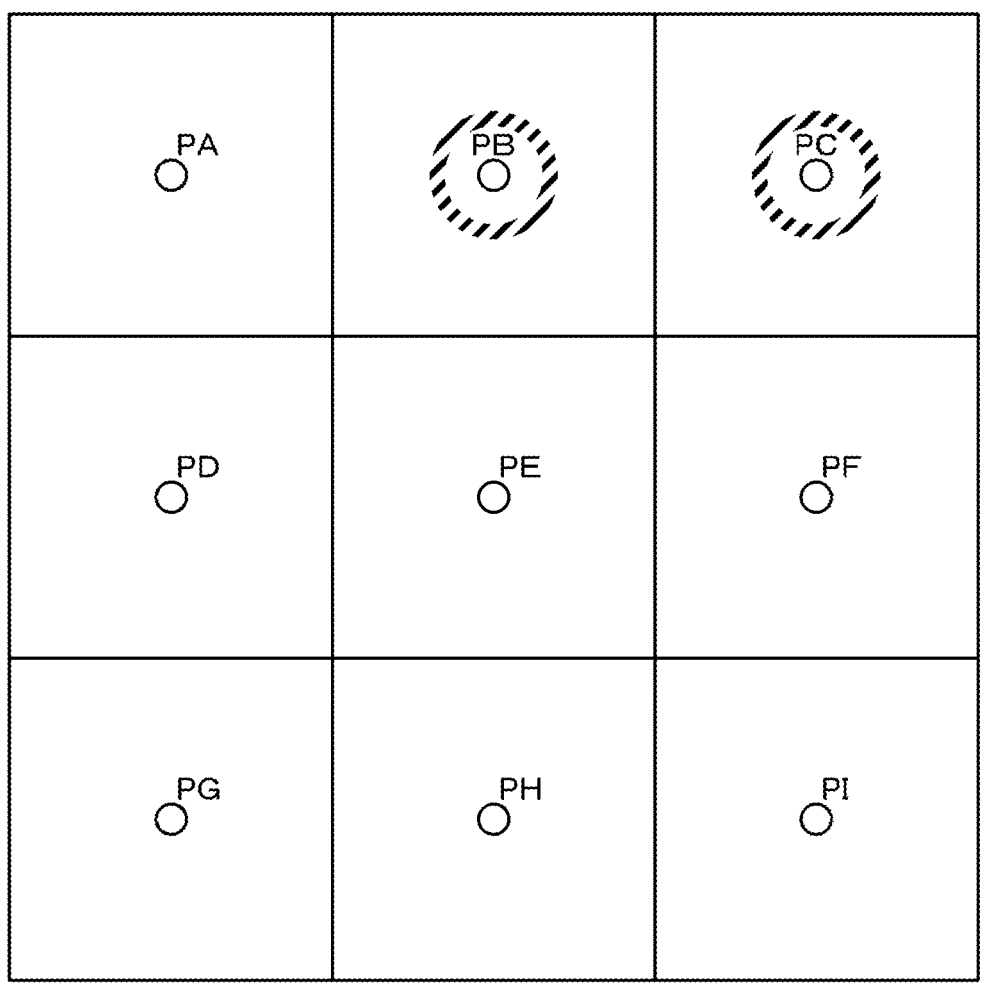
 IMAGINARY IMAGE OF SOUND IMAGE LOCALIZATION

SIGNAL PROCESSING DEVICE, SIGNAL PROCESSING METHOD, PROGRAM, AND VIDEO DISPLAY DEVICE

CROSS REFERENCE TO RELATED APPLICATIONS

This is a U.S. National Stage Application under 35 U.S.C. § 371, based on International Application No. PCT/JP2020/014599, filed Mar. 30, 2020, which claims priority to Japanese Patent Application JP 2019-081749, filed Apr. 23, 2019, each of which is hereby incorporated by reference in its entirety.

TECHNICAL FIELD

The present disclosure relates to a signal processing device, a signal processing method, a program, and a video display device.

BACKGROUND ART

Patent Document 1 describes a video display device that is configured to generate sound by vibrating a panel portion.

CITATION LIST

Patent Document

Patent Document 1: WO 2018/123310 A

SUMMARY OF THE INVENTION

Problems to be Solved by the Invention

In such a field, it is desirable not to reduce the sound pressure of an audio signal as much as possible while preventing a shift of a predetermined sound image position formed by the audio signal.

An object of the present disclosure is to provide a signal processing device, a signal processing method, a program, and a video display device that prevent the sound pressure of an audio signal from decreasing as much as possible while preventing a shift of a predetermined sound image position formed by the audio signal.

Solutions to Problems

The present disclosure provides, for example, a signal processing device including:
a first panel displacement control unit to which a first audio signal is input;
a second panel displacement control unit to which a second audio signal is input; and
a control unit configured to control the first panel displacement control unit and the second panel displacement control unit, in which
the first panel displacement control unit includes a first gain adjustment unit configured to adjust a level of the first audio signal,
the second panel displacement control unit includes a second gain adjustment unit configured to adjust a level of the second audio signal, and
the control unit includes
a correlation determination unit configured to determine presence or absence of a correlation between the first audio signal and the second audio signal, and
a gain control unit configured to control a level adjustment amount in each of the first gain adjustment unit and the second gain adjustment unit on the basis of a determination result of the correlation determination unit.

The present disclosure provides, for example, a signal processing method including:
causing a first gain adjustment unit included in a first panel displacement control unit to which a first audio signal is input to adjust a level of the first audio signal;
causing a second gain adjustment unit included in a second panel displacement control unit to which a second audio signal is input to adjust a level of the second audio signal;
causing a correlation determination unit included in a control unit to determine presence or absence of a correlation between the first audio signal and the second audio signal; and
causing a gain control unit included in the control unit to control a level adjustment amount in each of the first gain adjustment unit and the second gain adjustment unit on the basis of a determination result of the correlation determination unit.

The present disclosure provides, for example, a program that causes a computer to perform a signal processing method, the signal processing method including:
causing a first gain adjustment unit included in a first panel displacement control unit to which a first audio signal is input to adjust a level of the first audio signal;
causing a second gain adjustment unit included in a second panel displacement control unit to which a second audio signal is input to adjust a level of the second audio signal;
causing a correlation determination unit included in a control unit to determine presence or absence of a correlation between the first audio signal and the second audio signal; and
causing a gain control unit included in the control unit to control a level adjustment amount in each of the first gain adjustment unit and the second gain adjustment unit on the basis of a determination result of the correlation determination unit.

The present disclosure provides, for example, a video display device including:
a first video display panel;
a first vibrator configured to vibrate the first video display panel;
a second video display panel disposed at a position adjacent to the first video display panel;
a second vibrator configured to vibrate the second video display panel;
a first panel displacement control unit to which a first audio signal is input;
a second panel displacement control unit to which a second audio signal is input; and
a control unit configured to control the first panel displacement control unit and the second panel displacement control unit, in which
the first panel displacement control unit includes a first gain adjustment unit configured to adjust a level of the first audio signal,
the second panel displacement control unit includes a second gain adjustment unit configured to adjust a level of the second audio signal, and
the control unit includes
a correlation determination unit configured to determine presence or absence of a correlation between the first audio signal and the second audio signal, and a gain control unit configured to control a level adjustment amount in each of the first gain adjustment unit and the second gain adjustment unit on the basis of a determination result of the correlation determination unit.

BRIEF DESCRIPTION OF DRAWINGS

FIGS. 3A to 3C are diagrams referred to in describing a problem to be considered in the embodiment.

FIG. 13 is a diagram for describing a modification.
FIG. 14 is a diagram for describing a modification.

MODE FOR CARRYING OUT THE INVENTION

An embodiment and the like of the present disclosure will be described in the following order.

Embodiment

<Modification>

The embodiment and the like to be described below are preferred specific examples of the present disclosure, and the contents of the present disclosure are not limited to the embodiment and the like.

Embodiment

[Configuration Example of Video Display Device]
(Example of Appearance of Video Display Device)

Figure 1:
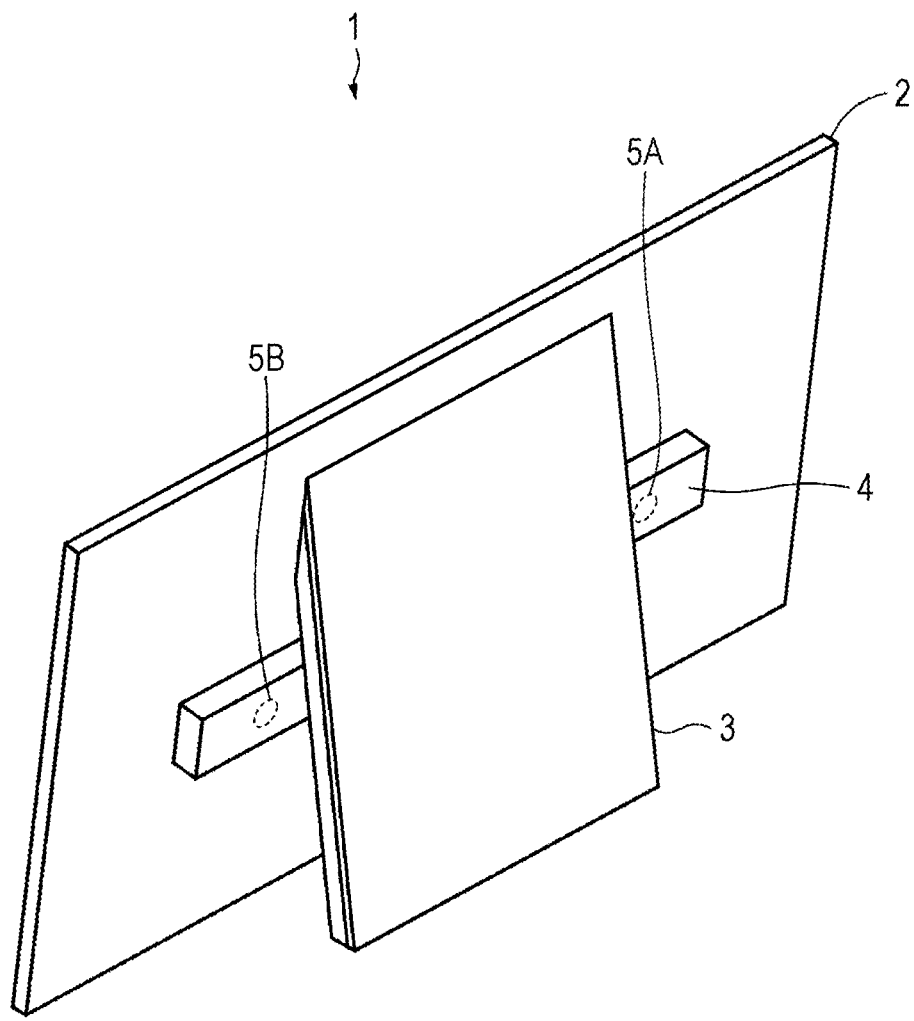
FIG. 1 is a perspective view of a video display device according to an embodiment.
Figure 2:
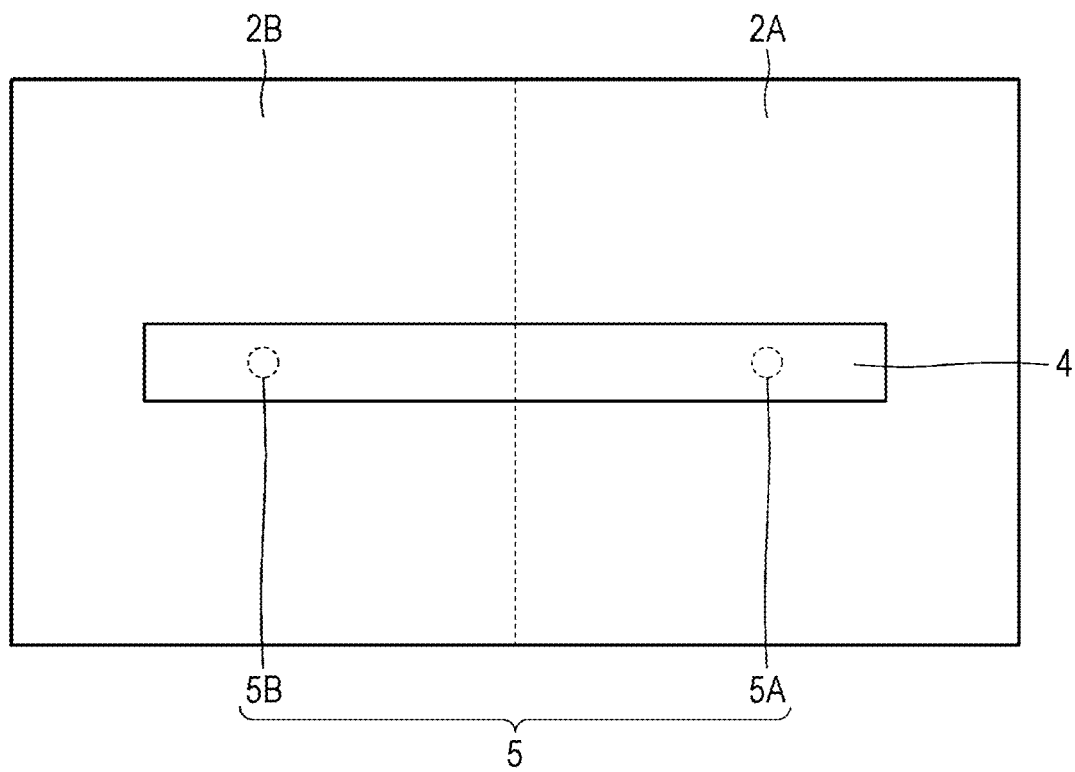
FIG. 2 is a back view of the video display device according to the embodiment.

FIGS. 1 and 2 are diagrams for describing a configuration example of a video display device (a video display device 1) according to the present embodiment. FIG. 1 is a perspective view of the video display device 1 as viewed from a back side (a surface opposite to a surface on which a video is displayed), and FIG. 2 is a plan view of the video display device 1 as viewed from the back side. The video display device 1 includes a panel portion 2, a support portion 3, and a storage portion 4.

The panel portion 2 is the panel portion 2 for displaying a video. As illustrated in FIG. 2, the panel portion 2 according to the present embodiment has a configuration obtained by joining two panel portions (a first video display panel 2A and a second video display panel 2B) disposed at positions adjacent to each other to integrate these two panel portions. The first video signal is displayed on the first video display panel 2A. Furthermore, the second video signal is displayed on the second video display panel 2B. Note that in a case where it is not necessary to distinguish between the first video display panel 2A and the second video display panel 2B, the first video display panel 2A and the second video display panel 2B are collectively referred to as "panel portion 2" as appropriate. An organic light emitting diode (OLED), a liquid crystal display (LCD), or the like can be applied to the panel portion 2.

The support portion 3 is attached to the back of the panel portion 2 and supports the panel portion 2. Note that the support portion 3 may be attached to the back surface of the panel portion 2 via a rotating portion such as a hinge. The inclination angle of the panel portion 2 may be adjusted by rotating the rotating portion to move the support portion 3. Note that in the present embodiment, the support portion 3 functions as a speaker of a subwoofer.

The storage portion 4 has, for example, a rod-like shape, and is installed on the back surface of the panel portion 2. The storage portion 4 stores a vibration portion 5 that vibrates the panel portion 2, a control circuit that supplies an audio signal to the vibration portion 5, and the like. The vibration portion 5 stored in the storage portion 4 includes, for example, two vibrators (a first vibrator 5A and a second vibrator 5B). The first vibrator 5A and the second vibrator 5B are, for example, piezoelectric actuators.

As illustrated in FIG. 2, the first vibrator 5A is installed near the center of the back surface of the first video display panel 2A, and the second vibrator 5B is installed near the center of the back surface of the second video display panel 2B.

The first vibrator 5A vibrates in a direction substantially orthogonal to the display surface when the first audio signal is input. When the vibration of the first vibrator 5A is transmitted to the first video display panel 2A, the first video display panel 2A vibrates, and sound based on the vibration is generated. The first audio signal is, for example, a left (L) channel signal.

The second vibrator 5B vibrates in a direction substantially orthogonal to the display surface when the second audio signal is input. When the vibration of the second vibrator 5B is transmitted to the second video display panel 2B, the second video display panel 2B vibrates, and sound based on the vibration is generated. The second audio signal is, for example, a right (R) channel signal. Note that in a case where it is not necessary to distinguish between the first vibrator 5A and the second vibrator 5B, the first vibrator 5A and the second vibrator 5B are collectively referred to as "vibration portion 5" as appropriate.

Problem to be Considered in Embodiment

Meanwhile, in a system that vibrates the panel portion 2 to generate sound like the video display device 1 according to the present embodiment, it is necessary to pay attention to the occurrence of image shake. The image shake is a phenomenon in which an object or a viewer in a viewing space is reflected on the panel portion 2, and the object or the like reflected vibrates by the vibration of the panel portion 2. Since the object or the like reflected on the panel portion 2 is irrelevant to a video displayed on the panel portion 2, the viewer of the video feels uncomfortable when the image shake occurs. Consequently, it is desirable to suppress the occurrence of image shake as much as possible.

FIG. 3A is a diagram illustrating an example of displacement characteristics of the panel portion 2. The displacement characteristics of the panel portion 2 are frequency characteristics of displacement (mm) measured in a case where an audio signal with a constant input voltage is input to the vibration portion 5 to vibrate the panel portion 2. As illustrated in FIG. 3A, the lower the frequency, the larger the displacement amount. In addition, a threshold indicating whether or not image shake occurs is set, and when the displacement amount of the panel portion 2 exceeds the threshold, the image shake becomes conspicuous to such an extent that the image shake is visually recognized.

As a solution for effectively suppressing image shake, a method of using a high-pass filter having characteristics as schematically illustrated in FIG. 3B is conceivable. By cutting a low-frequency component using the high-pass filter, as illustrated in FIG. 3C, the displacement amount of the video display panel can be prevented from exceeding the threshold, and the image shake can be effectively suppressed. However, since the low frequency is always cut by a fixed high-pass filter in this method, there is a possibility that a signal of a low-frequency component that does not exceed the threshold is also cut.

Meanwhile, the degree of conspicuousness of the image shake varies depending on the characteristics of a video input to the panel portion 2, the brightness of the space in which the panel portion 2 is present, the specification such as the reflectance of the panel portion 2, the viewing position, and the like even if the displacement amount of the identical panel portion 2 is used. Consequently, it is preferable to dynamically change the threshold indicating whether or not image shake occurs according to the factors described above.

Figure 4:
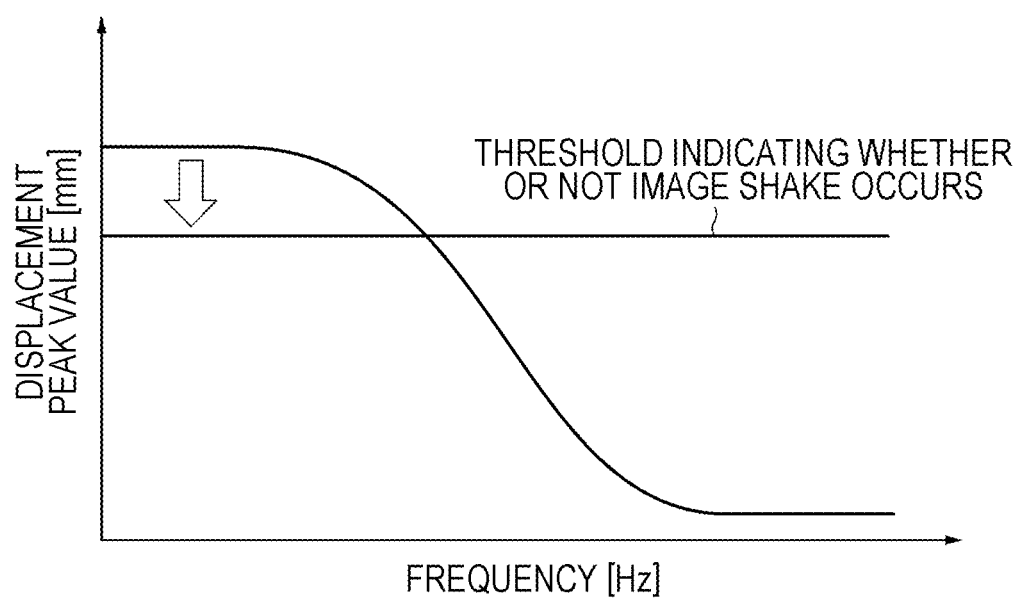
FIG. 4 is a diagram referred to in describing the problem to be considered in the embodiment.

For this reason, the threshold indicating whether or not image shake occurs is appropriately set in the present embodiment. Furthermore, as illustrated in FIG. 4, in a case where the displacement amount of the panel portion 2 exceeds the threshold, the level of an audio signal is reduced. As described above, the lower the frequency of the audio signal, the larger the displacement amount of the panel portion 2, so that the level of the low-frequency component of the audio signal is mainly attenuated. As a result, the vibration of the panel portion 2 can be suppressed, and thus the occurrence of image shake can be suppressed.

Furthermore, in a case where signals of two different channels are input to the first video display panel 2A and the second video display panel 2B adjacent to each other as in the present embodiment, it is necessary to pay attention to the possibility that a sound image position formed by an audio signal is shifted. For example, in a case where each of the audio signals of two channels includes a signal for localizing a sound image between the two panels, that is, a signal for localizing a sound image at the center, if only the level of one of the audio signals is attenuated, the sound image position is shifted from the center. In order to avoid such a problem, if the attenuation amounts of both channels are always the same, there is a problem that the level of the low-frequency component of one of the audio signals is unnecessarily attenuated although the audio signals of both channels are independent audio signals (for example, in a case where the audio signal of each channel is an audio signal of a different musical instrument). Therefore, control is executed in the present embodiment, in which sound image localization is maintained while image shake is effectively suppressed, and further sound pressure is secured.

(Internal Configuration Example of Video Display Device)

Figure 5:
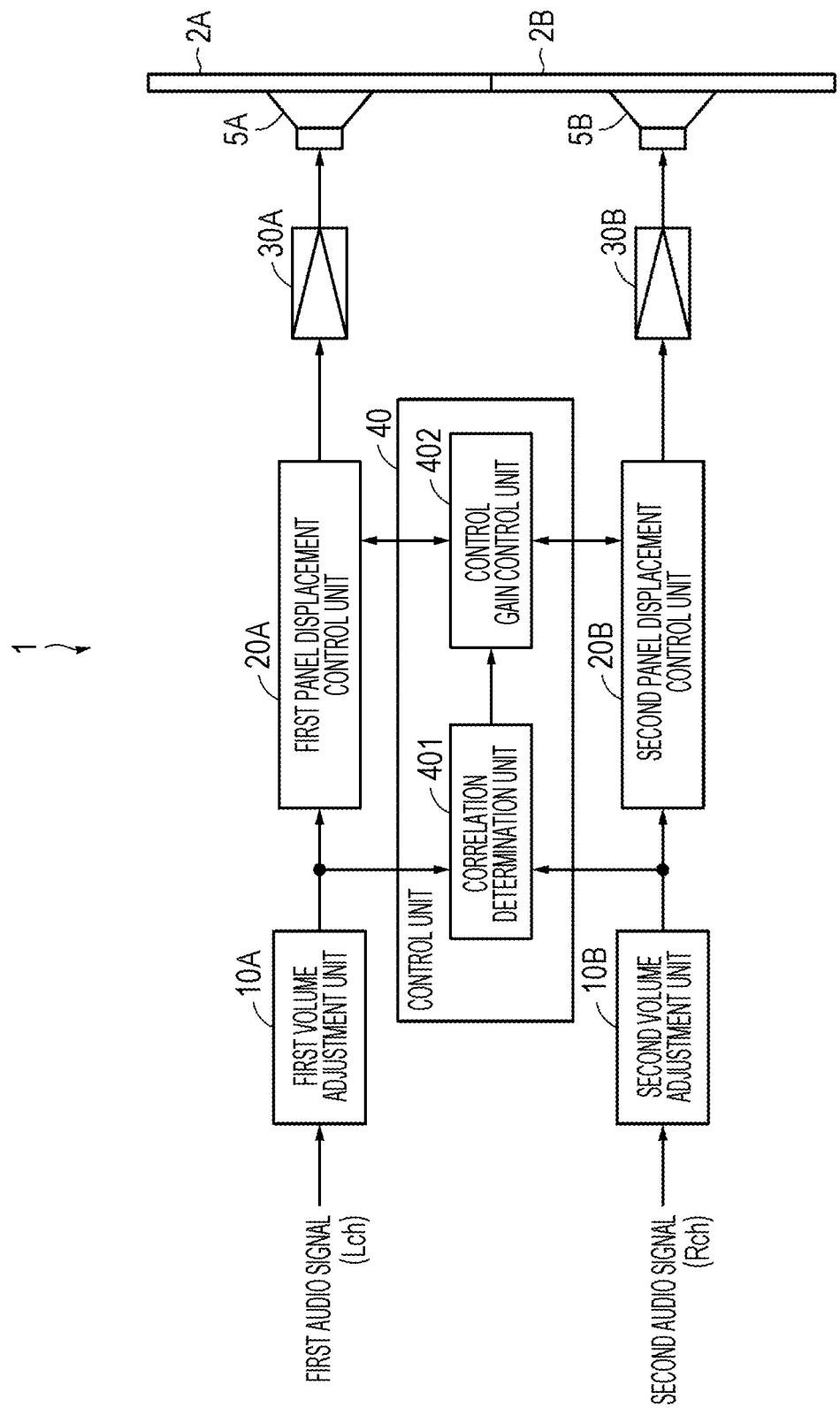
FIG. 5 is a block diagram including an internal configuration of the video display device according to the embodiment.

FIG. 5 is a block diagram illustrating a configuration including an internal configuration of the video display device 1. A video signal and an audio signal are input to the video display device 1 as source signals. The video signal and the audio signal are input to the video display device 1 through a broadcast, a network such as the Internet, from a hard disk, an appropriate memory such as an optical disk or a universal serial bus (USB) memory, or the like. Note that a configuration of processing a video signal is omitted in FIG. 5. The video signal input to the video display device 1 is processed by a known video processing circuit, and then supplied to and displayed on the panel portion 2.

In addition to the panel portion 2 and the vibration portion 5 described above, the video display device 1 includes a first volume adjustment unit 10A, a first panel displacement control unit 20A, a first amplifier 30A, a second volume adjustment unit 10B, a second panel displacement control unit 20B, a second amplifier 30B, and a control unit 40.

The first panel displacement control unit 20A is connected to an output side of the first volume adjustment unit 10A. The first amplifier 30A is connected to an output side of the first panel displacement control unit 20A. The first vibrator 5A described above is connected to an output side of the first amplifier 30A.

The first volume adjustment unit 10A adjusts the volume so that the level of an input audio signal reaches a level corresponding to a set volume. The audio signal subjected to volume adjustment by the first volume adjustment unit 10A is output to the first panel displacement control unit 20A.

Schematically, the first panel displacement control unit 20A adjusts the level of the low-frequency component of the audio signal supplied from the first volume adjustment unit 10A on the basis of a control gain. The audio signal in which the level of the low-frequency component has been adjusted is output from the first panel displacement control unit 20A to the first amplifier 30A. Note that the low-frequency band means a band with a frequency lower than a predetermined threshold, and is, for example, about 20 Hz to 200 Hz.

The first amplifier 30A amplifies the audio signal supplied from the first panel displacement control unit 20A with a predetermined amplification factor. The audio signal amplified by the first amplifier 30A is supplied to the first vibrator 5A. The first vibrator 5A vibrates on the basis of the audio signal supplied from the first amplifier 30A, and then the first video display panel 2A vibrates due to the vibration of the first vibrator 5A. The viewer of the video display device 1 listens to the sound generated by the vibration of the first video display panel 2A.

The second panel displacement control unit 20B is connected to an output side of the second volume adjustment unit 10B. The second amplifier 30B is connected to an output side of the second panel displacement control unit 20B. The second vibrator 5B described above is connected to an output side of the second amplifier 30B.

The second volume adjustment unit 10B adjusts the volume so that the level of an input audio signal reaches a level corresponding to the same volume as the volume set in the first volume adjustment unit 10A. The audio signal subjected to volume adjustment by the second volume adjustment unit 10B is output to the second panel displacement control unit 20B.

Schematically, the second panel displacement control unit 20B adjusts the level of the low-frequency component of the audio signal supplied from the second volume adjustment unit 10B on the basis of a control gain. The input audio signal in which the level of the low-frequency component has been adjusted is output from the second panel displacement control unit 20B to the second amplifier 30B.

The second amplifier 30B amplifies the audio signal supplied from the second panel displacement control unit 20B with a predetermined amplification factor. The amplification factor of the second amplifier 30B is, for example, equal to the amplification factor of the first amplifier 30A. The audio signal amplified by the second amplifier 30B is supplied to the second vibrator 5B. The second vibrator 5B vibrates on the basis of the audio signal supplied from the second amplifier 30B, and then the second video display panel 2B vibrates due to the vibration of the second vibrator 5B. The viewer of the video display device 1 listens to the sound generated by the vibration of the second video display panel 2B.

(First Panel Displacement Control Unit)

Figure 6:
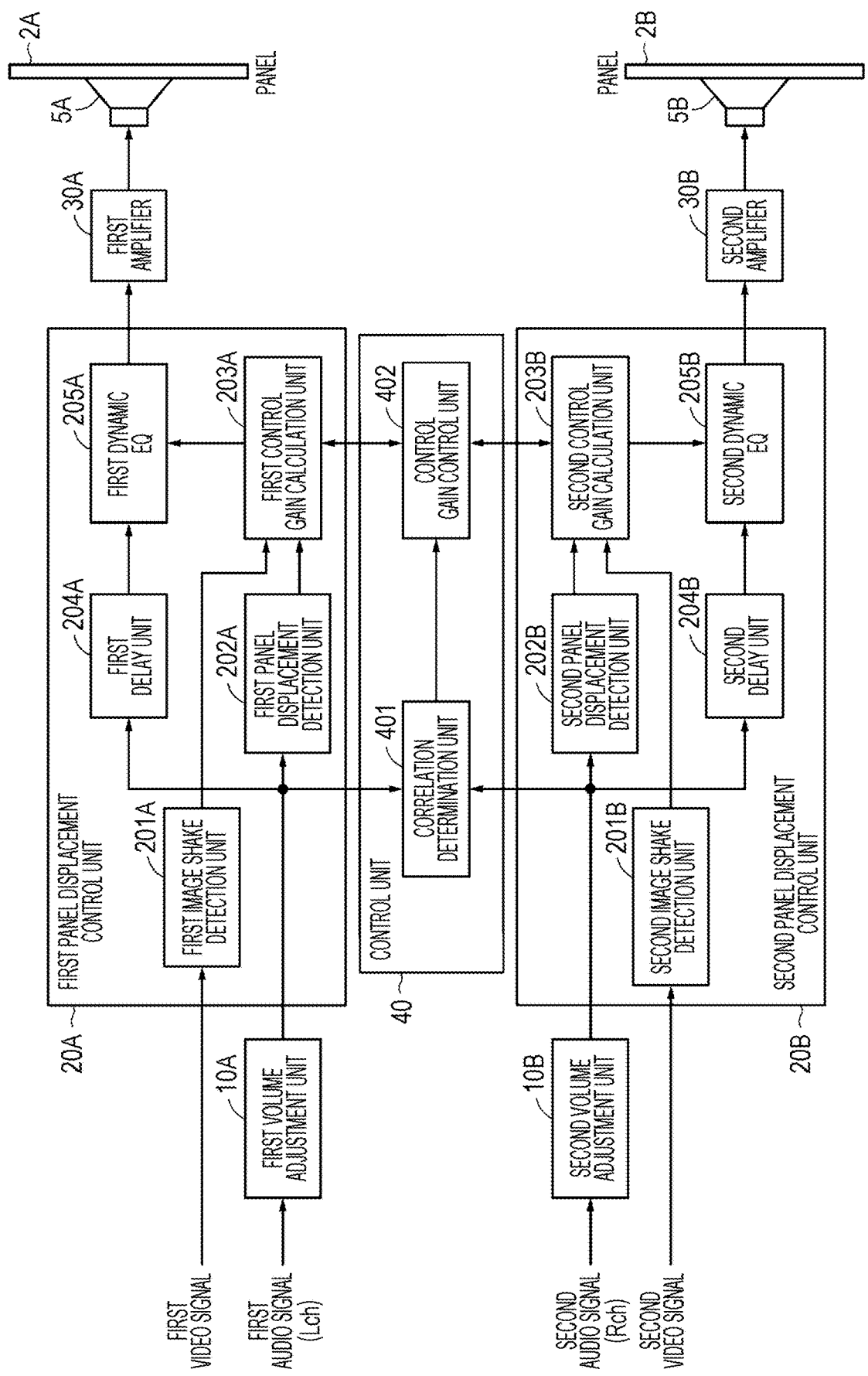
FIG. 6 is a block diagram including the internal configuration of the video display device according to the embodiment.

FIG. 6 is a diagram illustrating a configuration example of the first panel displacement control unit 20A and the second panel displacement control unit 20B in detail. As illustrated in FIG. 6, the first panel displacement control unit 20A includes, for example, a first image shake detection unit 201A as an example of a first threshold setting unit, a first panel displacement detection unit 202A as an example of a first displacement detection unit, a first control gain calculation unit 203A, a first delay unit 204A (delay), and a first dynamic equalizer (EQ) 205A as an example of a gain adjustment unit. The first video signal to be displayed on the first video display panel 2A is supplied to the first image shake detection unit 201A. The first audio signal of an L-channel supplied from the first volume adjustment unit 10A is supplied to each of the first panel displacement detection unit 202A and the first delay unit 204A.

The first image shake detection unit 201A calculates a displacement amount at which no image shake occurs, and sets the displacement amount calculated as a first threshold. For example, the first image shake detection unit 201A calculates the displacement amount on the basis of the characteristics of the first video signal input to the first image shake detection unit 201A. Specifically, the characteristics of the first video signal are characteristics related to the luminance of the first video signal. More specifically, the characteristics related to the luminance of the first video signal include a luminance average value obtained by averaging the luminance of each pixel in a frame constituting the first video signal. The first image shake detection unit 201A supplies the first threshold calculated to the first control gain calculation unit 203A.

In a case where the luminance of the first video signal is small, that is, in a case where the first video signal is a dark image as a whole, there is a high possibility that reflection occurs on the first video display panel 2A, and image shake in which reflection vibrates occurs. For this reason, in a case where the luminance of the first video signal is small, the first image shake detection unit 201A reduces the first threshold. By reducing the first threshold, the level of the low-frequency component of the audio signal is attenuated, and thus the vibration of the first video display panel 2A is suppressed. As a result, the occurrence of image shake can be effectively suppressed.

On the other hand, in a case where the luminance of the first video signal is large, that is, in a case where the first video signal is a bright image as a whole, reflection on the first video display panel 2A does not occur or is inconspicuous, so that there is a low possibility that image shake occurs. For this reason, in a case where the luminance of the first video signal is large, the first image shake detection unit 201A increases the first threshold. By setting the first threshold to be increased, the level of the low-frequency component of the first audio signal is maintained without being attenuated, or the attenuation amount is reduced. As a result, the sound pressure can be secured.

The first threshold corresponding to the luminance average value is set in advance as follows, for example. In a state where a certain number of subjects are viewing, a video signal with a predetermined average luminance value is input, and the first video display panel 2A is vibrated while changing the displacement amount. The displacement amount at which the number of subjects who visually recognize the image shake is more than or equal to a predetermined number is set as the first threshold corresponding to the luminance average value. A table, an arithmetic expression, or the like in which the average luminance value and the threshold are associated with each other is stored in an appropriate memory as the characteristics of the first video display panel 2A. The first image shake detection unit 201A calculates the luminance average value of the first video signal, and then calculates the first threshold at which no image shake occurs on the basis of the luminance average value calculated and the characteristics of the first video display panel 2A measured in advance. Note that the displacement amount at which no image shake occurs may be a displacement amount at which the number of subjects who visually recognize the image shake is zero, or a displacement amount at which the number of subjects who visually recognize the image shake is less than or equal to a certain number.

The first panel displacement detection unit 202A detects the displacement amount of the first video display panel 2A that is vibrated by the first vibrator 5A to generate sound on the basis of the first audio signal supplied from the first volume adjustment unit 10A. The first panel displacement detection unit 202A includes a filter that approximates displacement characteristics of the first video display panel 2A measured in advance (for example, a second-order infinite impulse response (IIR) low pass filter (LPF)). The first panel displacement detection unit 202A performs filter processing on the first audio signal to detect the displacement amount of the first video display panel 2A with respect to the input audio signal.

The first control gain calculation unit 203A compares the first threshold supplied from the first image shake detection unit 201A with the displacement amount detected by the first panel displacement detection unit 202A to calculate a first control gain on the basis of the comparison result. The first control gain is a parameter indicating the degree of reducing the level of a low-frequency component of an audio signal. The low-frequency band is a preset band. As described above, since the displacement amount of the first video display panel 2A becomes larger as the frequency is lower, the displacement amount of the first video display panel 2A can be reduced by attenuating the level of the low-frequency component of the first audio signal with the first control gain.

The first control gain calculation unit 203A calculates the first control gain corresponding to the amount by which the displacement amount detected by the first panel displacement detection unit 202A exceeds the first threshold. Specifically, the first control gain calculation unit 203A calculates a first control gain (−3 dB, −6 dB, or the like) with which the attenuation amount of the low-frequency component of the first audio signal increases as the amount by which the displacement amount detected by the first panel displacement detection unit 202A exceeds the threshold increases. In a case where the displacement amount detected by the first panel displacement detection unit 202A does not exceed the first threshold value, the first control gain calculation unit 203A outputs 0 dB (decibel) as the first control gain. When the first control gain is 0 dB, that is, one time, this means that the audio signal is output as it is without reducing the level of the low-frequency component.

The first delay unit 204A delays the first audio signal during the period in which the first control gain calculation unit 203A performs processing of calculating the first control gain. The first audio signal delayed by the first delay unit 204A is supplied to the first dynamic EQ 205A.

The first dynamic EQ 205A adjusts the level of the low-frequency component of the first audio signal. For example, the first dynamic EQ 205A adjusts the level of the low-frequency component of the first audio signal on the basis of the first control gain. Consequently, the displacement amount of the first video display panel 2A is suppressed, so that the occurrence of image shake can be suppressed. Furthermore, the first dynamic EQ 205A may adjust the level of the low-frequency component of the first audio signal on the basis of a control gain with an attenuation amount larger than that of the first control gain. Even in this case, since the attenuation amount of the control gain used for level adjustment is larger than the attenuation amount of the first control gain, the displacement amount of the first video display panel 2A can be suppressed, and thus the occurrence of image shake can be suppressed. The first audio signal processed by the first dynamic EQ 205A is then output to the first amplifier 30A. As the first dynamic EQ 205A, a shelving filter or a parametric equalizer can be applied.

(Second Panel Displacement Control Unit)

The second panel displacement control unit 20B includes, for example, a second image shake detection unit 201B as an example of a second threshold setting unit, a second panel displacement detection unit 202B as an example of a second displacement detection unit, a second control gain calculation unit 203B, a second delay unit 204B (delay), and a second dynamic EQ 205B as an example of a gain adjustment unit. The second video signal is supplied to the second image shake detection unit 201B. The second audio signal of an R-channel supplied from the second volume adjustment unit 10B is supplied to each of the second panel displacement detection unit 202B and the second delay unit 204B.

The second image shake detection unit 201B calculates a displacement amount at which no image shake occurs, and sets the displacement amount calculated as a second threshold. For example, the second image shake detection unit 201B calculates the displacement amount on the basis of the characteristics of the second video signal input to the second image shake detection unit 201B. Specifically, the characteristics of the second video signal are characteristics related to the luminance of the second video signal. More specifically, the characteristics related to the luminance of the second video signal include a luminance average value obtained by averaging the luminance of each pixel in a frame constituting the second video signal. The second image shake detection unit 201B supplies the second threshold calculated to the second control gain calculation unit 203B.

In a case where the luminance of the second video signal is small, that is, in a case where the second video signal is a dark image as a whole, there is a high possibility that reflection occurs on the second video display panel 2B, and image shake in which reflection vibrates occurs. For this reason, in a case where the luminance of the second video signal is small, the second image shake detection unit 201B reduces the second threshold. By reducing the second threshold, the level of the low-frequency component of the audio signal is attenuated, and thus the vibration of the second video display panel 2B is suppressed. As a result, the occurrence of image shake can be effectively suppressed.

On the other hand, in a case where the luminance of the second video signal is large, that is, in a case where the second video signal is a bright image as a whole, reflection on the second video display panel 2B does not occur or is inconspicuous, so that there is a low possibility that image shake occurs. For this reason, in a case where the luminance of the second video signal is large, the second image shake detection unit 201B increases the second threshold. By setting the second threshold to be increased, the level of the low-frequency component of the input audio signal is maintained without being attenuated, or the attenuation amount is reduced. As a result, the sound pressure can be secured. The second threshold corresponding to the luminance average value can be measured in advance by a method similar to that of the first threshold described above.

The second panel displacement detection unit 202B detects the displacement amount of the second video display panel 2B that is vibrated by the second vibrator 5B to generate sound on the basis of the second audio signal supplied from the second volume adjustment unit 10B. The second panel displacement detection unit 202B includes a filter that approximates displacement characteristics of the second video display panel 2B measured in advance (for example, a second-order IIR LPF). The second panel displacement detection unit 202B performs filter processing on the second audio signal to detect the displacement amount of the second video display panel 2B with respect to the second audio signal.

The second control gain calculation unit 203B compares the second threshold supplied from the second image shake detection unit 201B with the displacement amount detected by the second panel displacement detection unit 202B to calculate a second control gain on the basis of the comparison result. The second control gain is a parameter indicating the degree of reducing the level of the low-frequency component of the second audio signal. The low-frequency band is a preset band. As described above, since the displacement amount of the second video display panel 2B becomes larger as the second audio signal is in a lower frequency band, the displacement amount of the second video display panel 2B can be reduced by attenuating the level of the low-frequency component of the second audio signal with the second control gain.

The second control gain calculation unit 203B calculates the second control gain corresponding to the amount by which the displacement amount detected by the second panel displacement detection unit 202B exceeds the second threshold. Specifically, the second control gain calculation unit 203B calculates a second control gain (−3 dB, −6 dB, or the like) with which the attenuation amount of the low-frequency component of the second audio signal increases as the amount by which the displacement amount detected by the second panel displacement detection unit 202B exceeds the threshold increases. In a case where the displacement amount detected by the second panel displacement detection unit 202B does not exceed the second threshold value, the second control gain calculation unit 203B outputs 0 dB (decibel) as the second control gain. When the second control gain is 0 dB, that is, one time, this means that the audio signal is output as it is without reducing the level of the low-frequency component.

The second delay unit 204B delays the second audio signal during the period in which the second control gain calculation unit 203B performs processing of calculating the second control gain. The second audio signal delayed by the second delay unit 204B is supplied to the second dynamic EQ 205B.

The second dynamic EQ 205B adjusts the level of the low-frequency component of the second audio signal. For example, the second dynamic EQ 205B adjusts the level of the low-frequency component of the second audio signal on the basis of the first control gain. Consequently, the displacement amount of the second video display panel 2B is suppressed, so that the occurrence of image shake can be suppressed. Furthermore, the second dynamic EQ 205B may adjust the level of the low-frequency component of the second audio signal on the basis of a control gain with an attenuation amount larger than that of the second control gain. Even in this case, since the attenuation amount of the control gain used for level adjustment is larger than the attenuation amount of the second control gain, the displacement amount of the second video display panel 2B can be suppressed, and thus the occurrence of image shake can be suppressed. The second audio signal processed by the second dynamic EQ 205B is then output to the second amplifier 30B. As the second dynamic EQ 205B, a shelving filter or a parametric equalizer can be applied.

(Control Unit)

The control unit 40 includes a correlation determination unit 401 and a control gain control unit 402. The correlation determination unit 401 determines a correlation between an L-channel audio signal and an R-channel audio signal. The correlation determination unit 401 supplies the determination result to the control gain control unit 402.

As an example of a correlation calculation method, a known method can be applied. For example, the correlation determination unit 401 performs fast Fourier transform (FFT) on each channel signal to convert each channel signal from a time axis signal to a frequency axis signal. In such a method, the correlation determination unit 401 then calculates the power spectrum and cross spectrum of each channel signal, and calculates coherence from average values of the power spectrum and the cross spectrum. In a case where the coherence is between 0 and 1 and is equal to or larger than a threshold (for example, 0.8), the correlation determination unit 401 determines that the audio signals of both channels have a correlation. On the other hand, in a case where the value calculated by the operation is less than the threshold, the correlation determination unit 401 determines that there is no correlation between the audio signals of both channels. The frequency at which the coherence is calculated is limited to a low frequency. This is because, as described above, the panel portion 2 has displacement characteristics in which the panel portion 2 is largely displaced in a low-frequency band and the image shake occurs with the displacement. For example, after the FFT, the correlation between the audio signals of both channels is determined only in the low-frequency band.

The operation of determining coherence is specifically performed as follows. In a case where a signal sequence of an L-channel audio signal is denoted by x(t), a signal sequence of an R-channel audio signal is denoted by y(t), and spectra at each frequency point as a result of FFT of the respective signal sequences are denoted by X(f) and Y(f), power spectra $X^*(f)X(f)$ and $Y^*(f)Y(f)$ and cross spectrum $X^*(f)Y(f)$ at each frequency point are obtained, average values P1($f$) and P2($f$) of the power spectra and average value C(f) of the cross spectrum are respectively obtained, and then the coherence is obtained. Here, $X^*(f)$ and $Y^*(f)$ are complex conjugates of X(f) and Y(f), respectively. The coherence r is obtained by dividing the product of the average value C(f) of the cross spectrum and $C^*(f)$ that is a complex conjugate of the average value C(f) by the product of the average values P1($f$) and P2($f$) of the power spectra. Specifically, the coherence r is calculated by the following formula (1).

$$r^2 = (C(f)C^*(f))/(P1(f)P2(f)) \qquad (1)$$

In the case of this system, in consideration of performing FFT and acquiring average values, it may be necessary to delay source signals (first and second audio signals) by the coherence calculation processing time, or to pre-read source signals in advance.

In addition, the method of calculating the coherence of the low-frequency component also includes a method of passing only the low-frequency components through the LPF on the time axis, convolving the respective signals (one of the signals is delayed) to calculate a mutual coherence function, and determining the coherence on the basis of the result.

The case where the correlation determination unit 401 determines that there is a correlation between the audio signals of both channels (between first and second audio signals) is, for example, a case where the audio signals of both channels include a signal localized at the center. On the other hand, the case where the correlation determination unit 401 determines that there is no correlation between the audio signals of both channels is, for example, a case where the audio signals of the respective channels are independent audio signals (for example, audio signals of different musical instruments).

The control gain control unit 402 controls the level adjustment amount in each of the first dynamic EQ 205A and the second dynamic EQ 205B on the basis of the determination result of the correlation determination unit 401.

In a case where the correlation determination unit 401 determines that there is a correlation between the L-channel audio signal and the R-channel audio signal, the control gain control unit 402 sets a control gain with a larger adjustment amount among the first control gain and the second control gain in each of the first dynamic EQ 205A and the second dynamic EQ 205B. The first dynamic EQ 205A adjusts the level of the L-channel audio signal with the set control gain. The second dynamic EQ 205B adjusts the level of the R-channel audio signal with the set control gain.

In a case where the correlation determination unit 401 determines that there is no correlation between the L-channel audio signal and the R-channel audio signal, the control gain control unit 402 controls the first dynamic EQ 205A so as to adjust the level of the L-channel audio signal with the first control gain. Furthermore, in a case where the correlation determination unit 401 determines that there is no correlation between the L-channel audio signal and the R-channel audio signal, the control gain control unit 402 controls the second dynamic EQ 205B so as to adjust the level of the R-channel audio signal with the second control gain.

[Operation Example of Video Display Device]

(Outline of Operation)

The video display device 1 schematically performs an operation to be described below. The first image shake detection unit 201A calculates and sets a first threshold on the basis of the characteristics of a first video signal. The first panel displacement detection unit 202A performs filter processing on a first audio signal to calculate the displacement amount of the first video display panel 2A with respect to the first audio signal. The first control gain calculation unit 203A then compares the first threshold set by the image shake detection unit 201 with the displacement amount of the first video display panel 2A calculated by the first panel displacement detection unit 202A. As a result of the comparison, in a case where the displacement amount of the first video display panel 2A is larger than the first threshold, the first control gain calculation unit 203A calculates a first control gain corresponding to the amount by which the displacement amount of the first video display panel 2A exceeds the first threshold such that the displacement amount of the first video display panel 2A falls below the first threshold. Note that in a case where the displacement amount of the first video display panel 2A is less than or equal to the first threshold, the level of the low-frequency component of the input audio signal is output without being attenuated. For example, the first control gain calculation unit 203A sets 0 dB as the control gain. The above is the processing performed by the first panel displacement control unit 20A, but similar processing is also performed by the second panel displacement control unit 20B.

The correlation determination unit 401 of the control unit 40 determines whether there is a correlation between the L-channel audio signal and the R-channel audio signal. The presence or absence of the correlation is determined on a sample basis or on a frame basis. The determination result of the correlation determination unit 401 is supplied to the control gain control unit 402. In a case where the determination result indicates that there is a correlation between the audio signals of both channels, the control gain control unit 402 acquires the first control gain from the first control gain calculation unit 203A and acquires the second control gain from the second control gain calculation unit 203B. Next, the control gain control unit 402 compares the first control gain with the second control gain, and determines a control gain with a larger attenuation amount. The control gain control unit 402 then supplies the control gain with a larger attenuation amount to each of the first control gain calculation unit 203A and the second control gain calculation unit 203B, and sets the control gain with a larger attenuation amount in each of the first control gain calculation unit 203A and the second control gain calculation unit 203B.

The first control gain calculation unit 203A supplies the control gain set by the control gain control unit 402 to the first dynamic EQ 205A. The first dynamic EQ 205A adjusts the level of the low-frequency component of the L-channel audio signal on the basis of the control gain supplied. The second control gain calculation unit 203B supplies the control gain set by the control gain control unit 402 to the second dynamic EQ 205B. The second dynamic EQ 205B adjusts the level of the low-frequency component of the R-channel audio signal on the basis of the control gain supplied.

In a case where the determination result indicates that there is no correlation between the audio signals of both channels, the control gain control unit 402 instructs the first control gain calculation unit 203A to use the first control gain. In response to the control of the control gain control unit 402, the first control gain calculation unit 203A supplies the first control gain calculated by the first control gain calculation unit 203A to the first dynamic EQ 205A. The first dynamic EQ 205A adjusts the level of the low-frequency component of the L-channel audio signal on the basis of the first control gain. In addition, the control gain control unit 402 instructs the second control gain calculation unit 203B to use the second control gain. In response to the control of the control gain control unit 402, the second control gain calculation unit 203B supplies the second control gain calculated by the second control gain calculation unit 203B to the second dynamic EQ 205B. The second dynamic EQ 205B adjusts the level of the low-frequency component of the R-channel audio signal on the basis of the second control gain.

Figure 7:
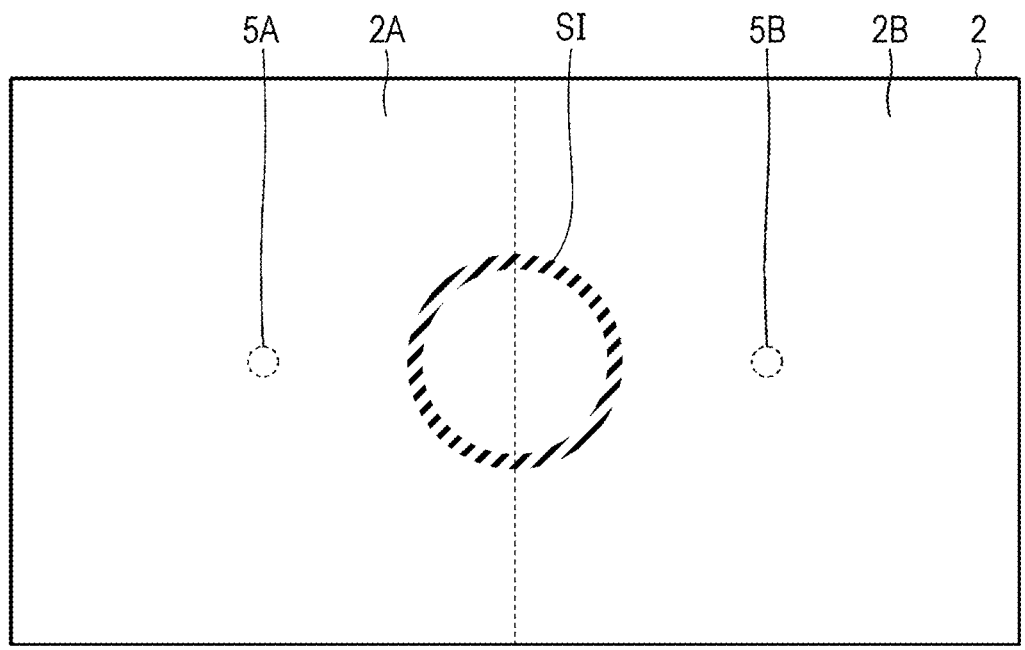
FIG. 7 is a diagram schematically illustrating localization of a sound image at a center.

As described above, in a case where there is a correlation between the L-channel audio signal and the R-channel audio signal, the levels of the low-frequency components in the audio signals of both channels are attenuated by the same control gain (the gain adjustment amounts are synchronized). Consequently, even in a case where the L-channel audio signal and the R-channel sound signal include sound localized at the center, as schematically illustrated in FIG. 7, it is possible to prevent a sound image SI from shifting from the vicinity of the center of the panel portion 2. Note that FIG. 7 is a front view of the panel portion 2 as viewed from the side of a video display surface.

Further, level adjustment is performed using a control gain with a larger attenuation amount among the first control gain and the second control gain. As a result, the occurrence of image shake can be effectively suppressed.

Figure 8:
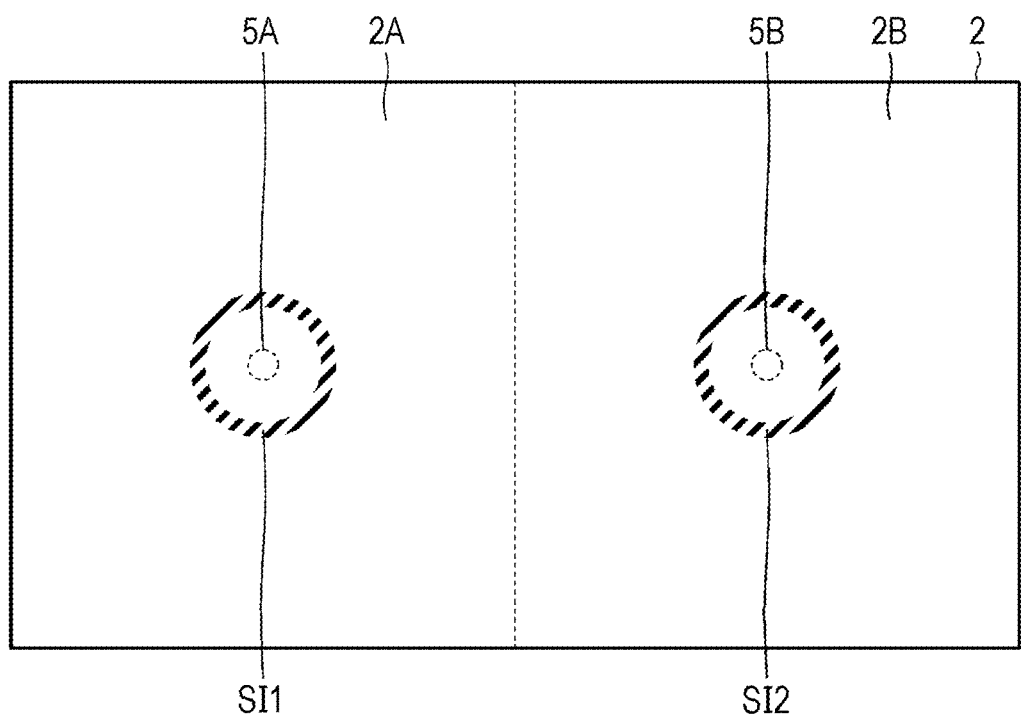
FIG. 8 is a diagram schematically illustrating a state where a sound image is localized at a place where audio of each channel is output.

Furthermore, in a case where there is no correlation between the L-channel audio signal and the R-channel audio signal, the level of the low-frequency component in the audio signal of the corresponding channel is attenuated by each of the first control gain and the second control gain (the gain adjustment amounts are made asynchronous). As a result, the occurrence of image shake can be effectively suppressed, and unnecessary limitation of the sound pressure can be prevented. Moreover, since the gain adjustment amount is asynchronous, as schematically illustrated in FIG. 8, a sound image (sound image SI1, SI2) corresponding to the audio signal of each channel can be formed.

Figure 9:
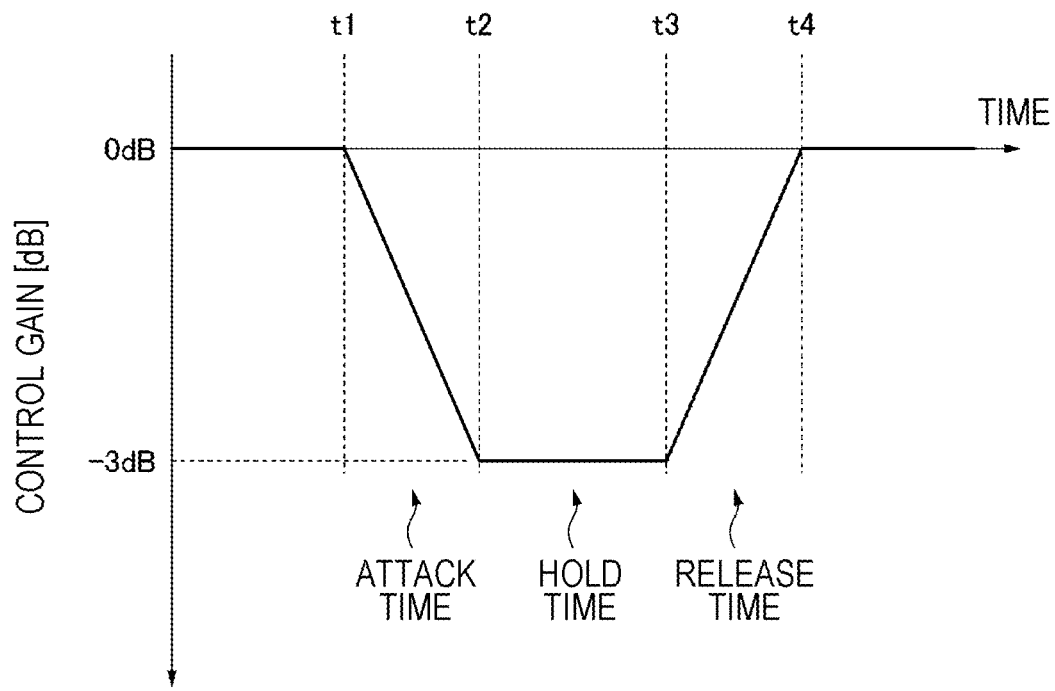
FIG. 9 is a diagram for describing attack time, hold time, and release time according to the embodiment.

Note that attack time, hold time, and release time can be set in the first control gain. It is assumed that, for example, −3 dB is calculated as the first control gain. As illustrated in FIG. 9, the attack time is a period (a period from t1 to t2 in FIG. 9) for gradually changing the first control gain from 0 dB to −3 dB. In addition, the hold time is a period (a period from t2 to t3 in FIG. 9) in which the state where the first control gain is −3 dB is maintained. The release time is a time (a period from t3 to t4 in FIG. 9) taken to return the first control gain to 0 dB after the first control gain does not need to be −3 dB.

As described above, in the present embodiment, the processing is performed by the dynamic EQ 205 while the first control gain is changed on the basis of the attack time and the release time. Note that in a case where −3 dB is calculated again as the first control gain while the first control gain is changing during the release time, processing of gradually changing the first control gain at that timing is performed so that the first control gain is −3 dB.

When the level of the low-frequency component of the first audio signal rapidly attenuates, the viewer may feel uncomfortable from an auditory point of view. By appropriately setting the attack time, the hold time, and the release time, it is possible to prevent the level of the low-frequency component of the first audio signal from being rapidly attenuated. In addition, human hearing is insensitive to a decrease in sound pressure, but is sensitive to an increase in sound pressure. In consideration of such auditory characteristics, in the present embodiment, the level of the low-frequency component of the first audio signal is quickly attenuated by setting the attack time to be short, thereby preventing the occurrence of image shake. Furthermore, by setting the release time longer than the attack time, the level of the low-frequency component of the first audio signal is gradually increased. As a result, it is possible to prevent the viewer from feeling uncomfortable due to a change in the level of the low-frequency component of the first audio signal while suppressing the occurrence of image shake. Note that the attack time, the hold time, and the release time can be set similarly in the second control gain.

(Details of Operation)

Figure 10:
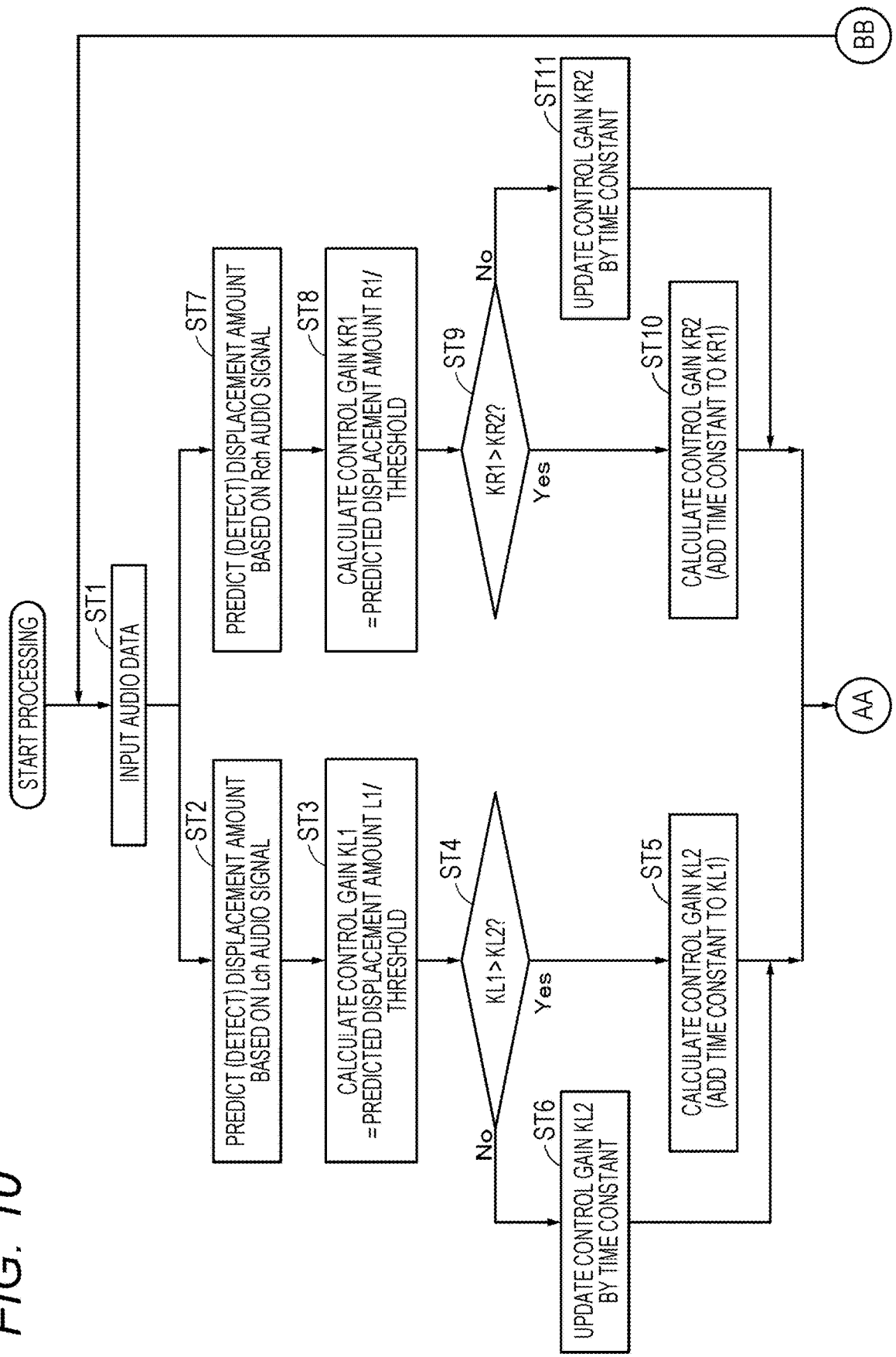
FIG. 10 is a flowchart illustrating a flow of processing performed by the video display device according to the embodiment.
Figure 11:
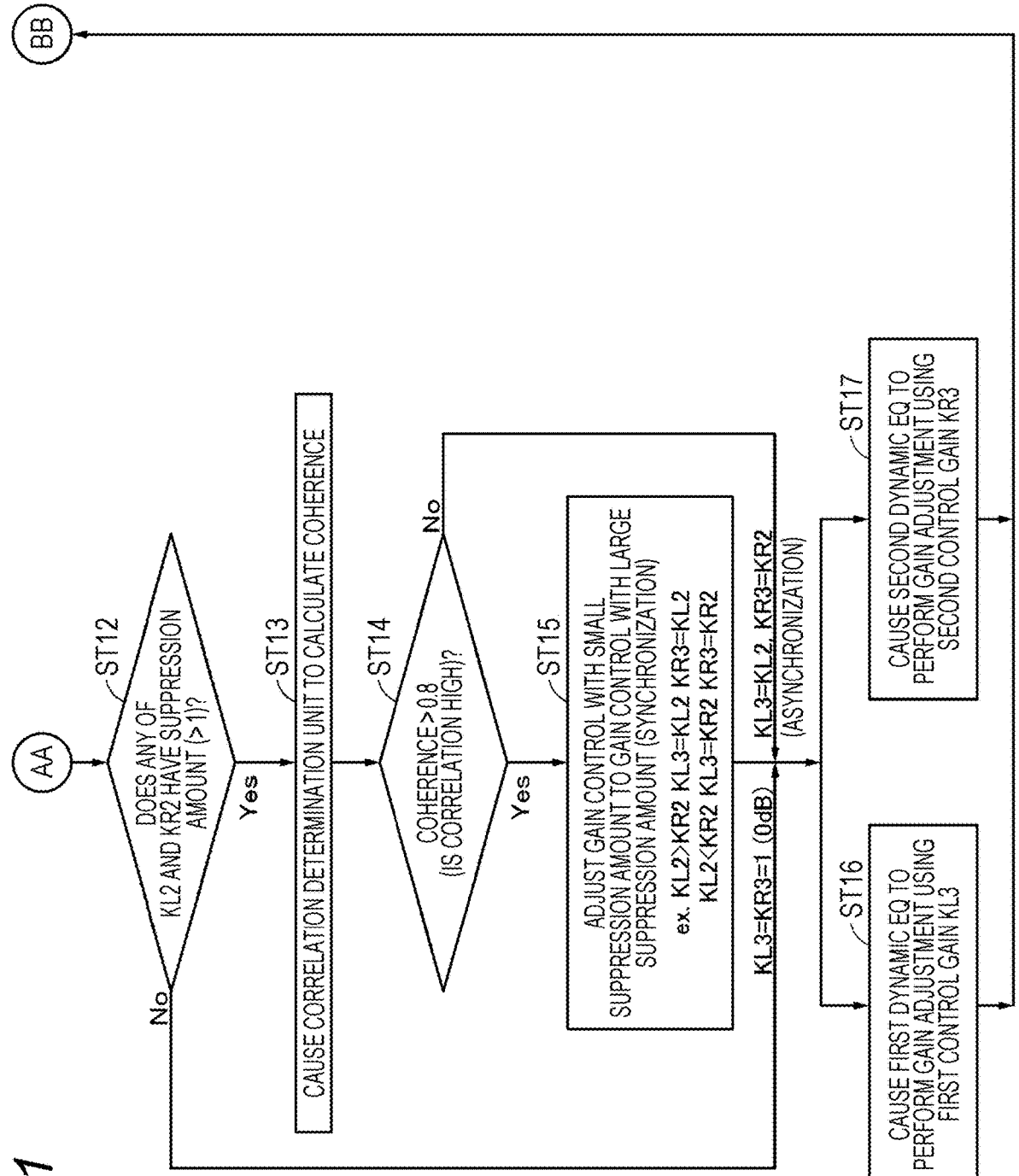
FIG. 11 is a flowchart illustrating a flow of processing performed by the video display device according to the embodiment.

FIGS. 10 and 11 are flowcharts illustrating in detail a flow of processing performed by the first panel displacement control unit 20A, the second panel displacement control unit 20B, and the control unit 40. Note that the respective reference numerals "AA" and "BB" in FIGS. 10 and 11 indicate continuity of processing, and do not mean specific processing.

When the processing starts, in step ST1, audio data is input to each of the first panel displacement control unit 20A and the second panel displacement control unit 20B. Specifically, the L-channel audio signal subjected to volume adjustment is input to the first panel displacement control unit 20A, and the R-channel audio signal subjected to volume adjustment is input to the second panel displacement control unit 20B. Then, the processing proceeds to step ST2.

In step ST2, the first panel displacement detection unit 202A performs filter processing on the L-channel audio signal to predict the displacement amount of the first video display panel 2A due to the input of the L-channel audio signal. Then, the processing proceeds to step ST3.

In step ST3, the first control gain calculation unit 203A calculates a control gain KL1 that is the suppression amount of the L-channel audio signal. The control gain KL1 is calculated by, for example, predicted displacement amount L1/threshold (threshold detected by the first image shake detection unit 201A). Then, the processing proceeds to step ST4.

In step ST4, the first control gain calculation unit 203A determines whether or not KL1>KL2. KL2 is, for example, a currently set control gain. In a case where KL1>KL2 holds, the processing proceeds to step ST5.

In step ST5, the control gain KL2 is calculated. Here, the control gain obtained by adding a time constant (the attack time, hold time, or release time described above) to the control gain KL1 with a large suppression amount is calculated as the control gain KL2. Then, the processing proceeds to step ST12.

In a case where KL1>KL2 does not hold, the processing proceeds to step ST6. In step ST6, the control gain KL2 is updated by the time constant. Then, the processing proceeds to step ST12.

The second panel displacement control unit 20B performs similar processing on the R-channel audio signal. In step ST7 subsequent to ST1, the second panel displacement detection unit 202B performs filter processing on the R-channel audio signal to predict the displacement amount of the second video display panel 2B due to the input of the R-channel audio signal. Then, the processing proceeds to step ST8.

In step ST8, the second control gain calculation unit 203B calculates a control gain KR1 that is the suppression amount of the R-channel audio signal. The control gain KR1 is calculated by, for example, predicted displacement amount R1/threshold (threshold detected by the second image shake detection unit 201B). Then, the processing proceeds to step ST9.

In step ST9, the second control gain calculation unit 203B determines whether or not KR1>KR2. KR2 is, for example, a currently set control gain. In a case where KR1>KR2 holds, the processing proceeds to step ST10.

In step ST10, the control gain KR2 is calculated. Here, the control gain obtained by adding the time constant (the attack time, hold time, or release time described above) to the control gain KR1 with a large suppression amount is calculated as the control gain KR2. Then, the processing proceeds to step ST12.

In a case where KR1>KR2 does not hold, the processing proceeds to step ST11. In step ST6, the control gain KR2 is updated by the time constant. Then, the processing proceeds to step ST12.

It is determined in step ST12 whether or not any of the control gains KL2 and KR2 is a value for suppressing the audio signal (for example, >1). This determination is made by the control gain control unit 402 that has received the control gains KL2 and KR2 calculated by the first control gain calculation unit 203A and the second control gain calculation unit 203B, respectively. In a case where the control gain KL2 or KR2 is a values for suppressing the audio signal, the processing proceeds to step ST13.

In step ST13, the correlation determination unit 401 calculates coherence between the L-channel audio signal and the R-channel audio signal. Then, the processing proceeds to step ST14.

In step ST14, the correlation determination unit 401 compares the coherence calculated with the threshold to determine whether or not the correlation between the L-channel audio signal and the R-channel audio signal is high. In a case where the correlation determination unit 401 determines that the correlation between the audio signals of both channels is high, the processing proceeds to step ST15.

In step ST15, the control gain control unit 402 adjusts (synchronizes) the control gain KL2, KR2 to a value with a large suppression amount. Specifically, in a case where KL2>KR2 holds, the control gain KL3 and the control gain KR3 are set to be equal to the value of KL2. In addition, in a case where KL2<KR2 holds, the control gain KL3 and the second control gain KR3 are set to be equal to the value of KR2.

The control gain control unit 402 supplies the set control gain KL3 to the first control gain calculation unit 203A. The first control gain calculation unit 203A then supplies the control gain KL3 to the first dynamic EQ 205A. Furthermore, the control gain control unit 402 supplies the set control gain KR3 to the second control gain calculation unit 203B. The second control gain calculation unit 203B then supplies the control gain KR3 to the second dynamic EQ 205B. Then, the processing proceeds to step ST16 and step ST17.

In step ST16, the first dynamic EQ 205A adjusts the gain of the L-channel audio signal using the control gain KL3. Furthermore, in step ST17, the second dynamic EQ 205B adjusts the gain of the R-channel audio signal using the control gain KR3. The processing then returns to step ST1, and similar processing is performed when the audio data of the next sample is input.

In a case where the correlation determination unit 401 determines that the correlation between both channels is low (No in the determination of step ST14), the control gain control unit 402 instructs the first control gain calculation unit 203A to use the control gain KL2 calculated by the first control gain calculation unit 203A, that is, the first control gain as the control gain KL3. In response to the control of the control gain control unit 402, the first control gain calculation unit 203A supplies the control gain KL3, which is KL3=KL2, to the first dynamic EQ 205A. In addition, the control gain control unit 402 instructs the second control gain calculation unit 203B to use the control gain KR2 calculated by the second control gain calculation unit 203B, that is, the second control gain as the control gain KR3. In response to the control of the control gain control unit 402, the second control gain calculation unit 203B supplies the control gain KR3, which is KR3=KR2, to the second dynamic EQ 205B. Then, the processing proceeds to step ST16 and step ST17. The contents of the processing in step ST16 and step ST17 are as described above.

In step ST12, in a case where neither KL2 nor KR2 is a value for suppressing the audio signal (No in the determination of step ST12), 1 (0 dB) is set as the control gain KL3 and the control gain KR3. The first control gain calculation unit 203A supplies 0 dB as the control gain KL3 to the first dynamic EQ 205A. In addition, the second control gain calculation unit 203B supplies 0 dB as the control gain KR3 to the second dynamic EQ 205B. Then, the processing proceeds to step ST16 and step ST17. The contents of the processing in step ST16 and step ST17 are as described above.

According to the present embodiment described above, it is possible to prevent the sound pressure from being suppressed as much as possible while maintaining a sound image position. Furthermore, the occurrence of image shake can be effectively suppressed.

<Modification>

The embodiment of the present disclosure has been specifically described above, but the content of the present disclosure is not limited to the embodiment described above, and various modifications are possible on the basis of the technical idea of the present disclosure.

Figure 12:
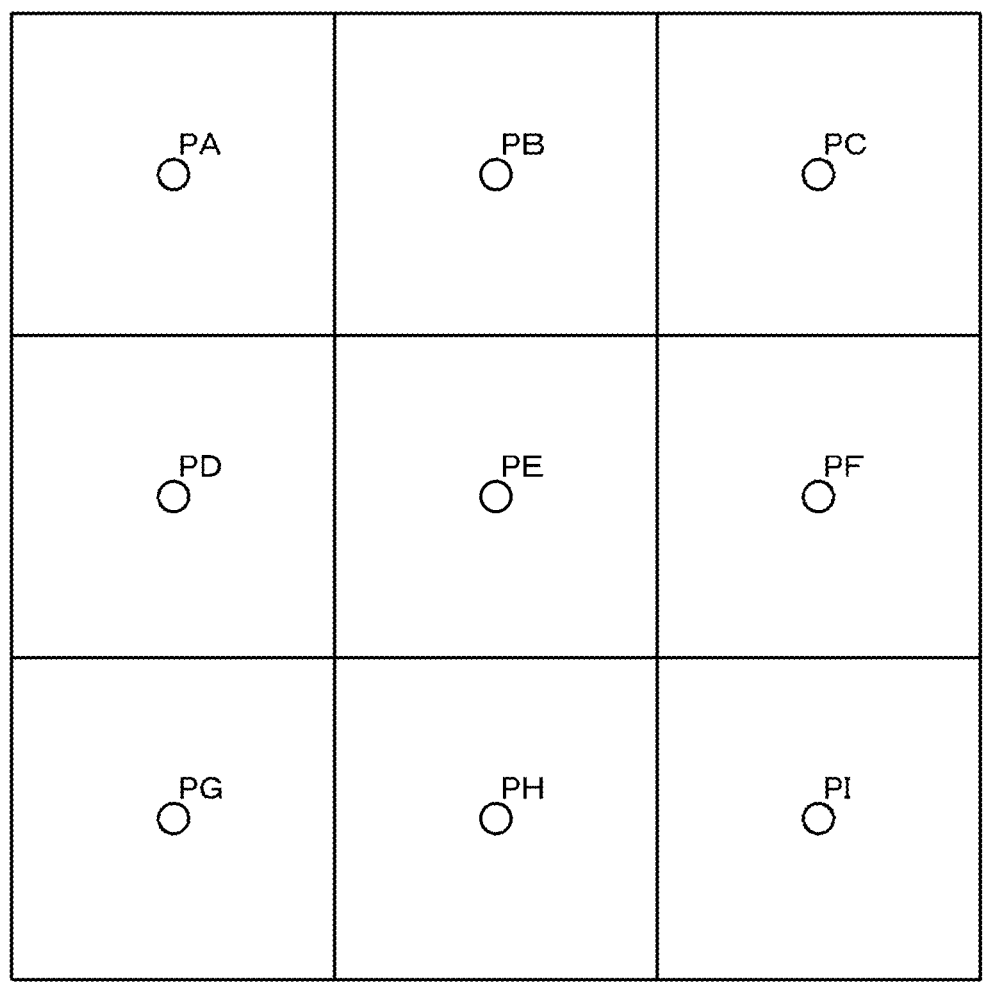
FIG. 12 is a diagram for describing a modification.
Figure 15:
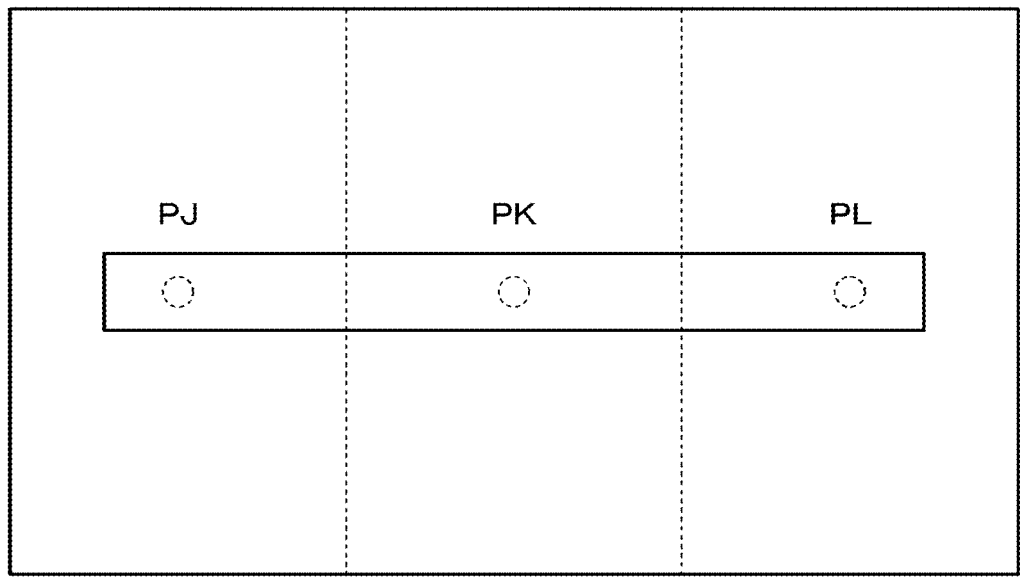
FIG. 15 is a diagram for describing a modification.

In the embodiment described above, the panel portion 2 includes two panels. However, as illustrated in FIG. 12, the panel portion 2 may include nine video display panels (video display panels PA, PB, PC . . . PI). A vibrator (schematically indicated by a circle) is joined to each of the nine video display panels. Then, processing similar to that in the embodiment may be performed on adjacent panel portions. For example, processing similar to that in the embodiment may be performed on the video display panels PB and PC. If there is a correlation between the audio signals for vibrating the video display panels PB and PC, the suppression amount is synchronized, so that the sound image can be localized between the video display panels PB and PC as schematically illustrated in FIG. 13. In a case where there is no correlation between the audio signals for vibrating the video display panels PB and PC, the suppression amount is not synchronized, so that the sound image can be localized in each of the video display panels PB and PC as schematically illustrated in FIG. 14. Furthermore, as illustrated in FIG. 15, the panel portion 2 may include three video display panels (video display panels PJ, PK, and PL).

The first volume adjustment unit 10A may be provided at a subsequent stage of the first panel displacement control unit 20A. In this case, it may be configured such that the volume information set in the first volume adjustment unit 10A is supplied to the first panel displacement detection unit 202A. The first panel displacement detection unit 202A may perform filter processing according to the volume information. This also applies to the second volume adjustment unit 10B.

In the flow of processing described in the embodiment, the order of some processes may be changed, or some processes may be performed in parallel.

The first audio signal and the second audio signal are not limited to the L-channel audio signal and the R-channel audio signal, respectively, and may be audio signals corresponding to objects used in object audio.

The present disclosure can also be implemented by a device, a method, a program, a system, and the like. For example, a program that performs the functions described in the above embodiment can be downloaded, and a device that does not have the functions described in the embodiment downloads and installs the program, so that the control described in the embodiment can be executed in the device. The present disclosure can also be implemented by a server that distributes such a program. In addition, the matters described in each of the embodiment and the modification can be appropriately combined. Furthermore, the contents of the present disclosure are not to be construed as being limited by the effects exemplified in the present specification.

The present disclosure can also adopt the following configurations.

(1)

A signal processing device including:

a first panel displacement control unit to which a first audio signal is input;

a second panel displacement control unit to which a second audio signal is input; and a control unit configured to control the first panel displacement control unit and the second panel displacement control unit, in which the first panel displacement control unit includes a first gain adjustment unit configured to adjust a level of the first audio signal, the second panel displacement control unit includes a second gain adjustment unit configured to adjust a level of the second audio signal, and the control unit includes a correlation determination unit configured to determine presence or absence of a correlation between the first audio signal and the second audio signal, and a gain control unit configured to control a level adjustment amount in each of the first gain adjustment unit and the second gain adjustment unit on the basis of a determination result of the correlation determination unit.

(2)

The signal processing device according to (1), in which the first panel displacement control unit further includes a first displacement detection unit configured to detect a displacement amount of a first video display panel that is vibrated to generate sound on the basis of the first audio signal, and a first threshold setting unit configured to calculate a displacement amount at which no image shake occurs and set a displacement amount calculated as a first threshold, the first gain adjustment unit adjusts a level of the first audio signal on the basis of a result of comparison between a displacement amount detected by the first displacement detection unit and the first threshold, the second panel displacement control unit further includes a second displacement detection unit configured to detect a displacement amount of a second video display panel that is vibrated to generate sound on the basis of the second audio signal, and a second threshold setting unit configured to calculate a displacement amount at which no image shake occurs and set a displacement amount calculated as a second threshold, and the second gain adjustment unit adjusts a level of the second audio signal on the basis of a result of comparison between a displacement amount detected by the second displacement detection unit and the second threshold.

(3)

The signal processing device according to (2), in which the first panel displacement control unit further includes a first control gain calculation unit configured to calculate a first control gain on the basis of a result of comparison between a displacement amount detected by the first displacement detection unit and the first threshold, and the second panel displacement control unit further includes a second control gain calculation unit configured to calculate a second control gain on the basis of a result of comparison between a displacement amount detected by the second displacement detection unit and the second threshold.

(4)

The signal processing device according to (3), in which in a case where it is determined that there is a correlation between the first audio signal and the second audio signal, the gain control unit sets a control gain with a large adjustment amount among the first control gain and the second control gain in each of the first gain adjustment unit and the second gain adjustment unit, the gain control unit controls the first gain adjustment unit to adjust a level of the first audio signal using a set control gain, and the gain control unit controls the second gain adjustment unit to adjust a level of the second audio signal using a set control gain.

(5)

The signal processing device according to (3) or (4), in which in a case where it is determined that there is no correlation between the first audio signal and the second audio signal, the gain control unit controls the first gain adjustment unit to adjust a level of the first audio signal using the first control gain, and the gain control unit controls the second gain adjustment unit to adjust a level of the second audio signal using the second control gain.

(6)

The signal processing device according to (2), in which the first displacement detection unit includes a filter that approximates a displacement characteristic of the first video display panel, the displacement characteristic being measured in advance, and the second displacement detection unit includes a filter that approximates a displacement characteristic of the second video display panel, the displacement characteristic being measured in advance.

(7)

The signal processing device according to any one of (1) to (6), in which the correlation determination unit determines a correlation between a low-frequency component of the first audio signal and a low-frequency component of the second audio signal.

(8)

The signal processing device according to any one of (2) to (7), in which the first video display panel and the second video display panel are panels disposed at positions adjacent to each other.

(9)

The signal processing device according to any one of (1) to (8), in which the first audio signal is a left (L) channel signal, and the second audio signal is a right (R) channel signal.

(10)

A signal processing method including:

causing a first gain adjustment unit included in a first panel displacement control unit to which a first audio signal is input to adjust a level of the first audio signal;

causing a second gain adjustment unit included in a second panel displacement control unit to which a second audio signal is input to adjust a level of the second audio signal;

causing a correlation determination unit included in a control unit to determine presence or absence of a correlation between the first audio signal and the second audio signal; and causing a gain control unit included in the control unit to control a level adjustment amount in each of the first gain adjustment unit and the second gain adjustment unit on the basis of a determination result of the correlation determination unit.

(11)

A program that causes a computer to perform a signal processing method, the signal processing method including:

causing a first gain adjustment unit included in a first panel displacement control unit to which a first audio signal is input to adjust a level of the first audio signal;

causing a second gain adjustment unit included in a second panel displacement control unit to which a second audio signal is input to adjust a level of the second audio signal;

causing a correlation determination unit included in a control unit to determine presence or absence of a correlation between the first audio signal and the second audio signal; and causing a gain control unit included in the control unit to control a level adjustment amount in each of the first gain adjustment unit and the second gain adjustment unit on the basis of a determination result of the correlation determination unit.

(12)

A video display device including:

a first video display panel;

a first vibrator configured to vibrate the first video display panel;

a second video display panel disposed at a position adjacent to the first video display panel;

a second vibrator configured to vibrate the second video display panel;

a first panel displacement control unit to which a first audio signal is input;

a second panel displacement control unit to which a second audio signal is input; and a control unit configured to control the first panel displacement control unit and the second panel displacement control unit, in which the first panel displacement control unit includes a first gain adjustment unit configured to adjust a level of the first audio signal, the second panel displacement control unit includes a second gain adjustment unit configured to adjust a level of the second audio signal, and the control unit includes a correlation determination unit configured to determine presence or absence of a correlation between the first audio signal and the second audio signal, and a gain control unit configured to control a level adjustment amount in each of the first gain adjustment unit and the second gain adjustment unit on the basis of a determination result of the correlation determination unit.

REFERENCE SIGNS LIST

1 Video display device
2 Panel portion
2A First video display panel
2B Second video display panel
5 Vibration portion
5A First vibrator
5B Second vibrator
20A First panel displacement control unit
20B Second panel displacement control unit
40 Control unit
201A First image shake detection unit
202A First panel displacement detection unit
203A First control gain calculation unit
205A First dynamic EQ
201B Second image shake detection unit
202B Second panel displacement detection unit
203B Second control gain calculation unit
205B Second dynamic EQ
401 Correlation determination unit
402 Control gain control unit

The invention claimed is:

1. A signal processing device comprising:
a first panel displacement control unit to which a first audio signal is input;
a second panel displacement control unit to which a second audio signal is input; and
a control unit configured to control the first panel displacement control unit and the second panel displacement control unit, wherein
the first panel displacement control unit includes a first gain adjustment unit configured to adjust a level of the first audio signal,
the second panel displacement control unit includes a second gain adjustment unit configured to adjust a level of the second audio signal, and
the control unit includes
a correlation determination unit configured to determine presence or absence of a correlation between the first audio signal and the second audio signal, and
a gain control unit configured to control a level adjustment amount in each of the first gain adjustment unit and the second gain adjustment unit on a basis of a determination result of the correlation determination unit.

2. The signal processing device according to claim 1, wherein
the first panel displacement control unit further includes
a first displacement detection unit configured to detect a displacement amount of a first video display panel that is vibrated to generate sound on a basis of the first audio signal, and
a first threshold setting unit configured to calculate a displacement amount at which no image shake occurs and set a displacement amount calculated as a first threshold,
the first gain adjustment unit adjusts a level of the first audio signal on a basis of a result of comparison between a displacement amount detected by the first displacement detection unit and the first threshold,
the second panel displacement control unit further includes
a second displacement detection unit configured to detect a displacement amount of a second video display panel that is vibrated to generate sound on a basis of the second audio signal, and
a second threshold setting unit configured to calculate a displacement amount at which no image shake occurs and set a displacement amount calculated as a second threshold, and
the second gain adjustment unit adjusts a level of the second audio signal on a basis of a result of comparison between a displacement amount detected by the second displacement detection unit and the second threshold.

3. The signal processing device according to claim 2, wherein
the first panel displacement control unit further includes
a first control gain calculation unit configured to calculate a first control gain on a basis of a result of comparison between a displacement amount detected by the first displacement detection unit and the first threshold, and
the second panel displacement control unit further includes
a second control gain calculation unit configured to calculate a second control gain on a basis of a result of comparison between a displacement amount detected by the second displacement detection unit and the second threshold.

4. The signal processing device according to claim 3, wherein
in a case where it is determined that there is a correlation between the first audio signal and the second audio signal, the gain control unit sets a control gain with a large adjustment amount among the first control gain and the second control gain in each of the first gain adjustment unit and the second gain adjustment unit,
the gain control unit controls the first gain adjustment unit to adjust a level of the first audio signal using a set control gain, and
the gain control unit controls the second gain adjustment unit to adjust a level of the second audio signal using a set control gain.

5. The signal processing device according to claim 3, wherein
in a case where it is determined that there is no correlation between the first audio signal and the second audio signal,
the gain control unit controls the first gain adjustment unit to adjust a level of the first audio signal using the first control gain, and
the gain control unit controls the second gain adjustment unit to adjust a level of the second audio signal using the second control gain.

6. The signal processing device according to claim 2, wherein
the first displacement detection unit includes a filter that approximates a displacement characteristic of the first video display panel, the displacement characteristic being measured in advance, and
the second displacement detection unit includes a filter that approximates a displacement characteristic of the second video display panel, the displacement characteristic being measured in advance.

7. The signal processing device according to claim 1, wherein
the correlation determination unit determines a correlation between a low-frequency component of the first audio signal and a low-frequency component of the second audio signal.

8. The signal processing device according to claim 2, wherein
the first video display panel and the second video display panel are panels disposed at positions adjacent to each other.

9. The signal processing device according to claim 1, wherein
the first audio signal is a left (L) channel signal, and the second audio signal is a right (R) channel signal.

10. A signal processing method comprising:
causing a first gain adjustment unit included in a first panel displacement control unit to which a first audio signal is input to adjust a level of the first audio signal;
causing a second gain adjustment unit included in a second panel displacement control unit to which a second audio signal is input to adjust a level of the second audio signal;
causing a correlation determination unit included in a control unit to determine presence or absence of a correlation between the first audio signal and the second audio signal; and
causing a gain control unit included in the control unit to control a level adjustment amount in each of the first gain adjustment unit and the second gain adjustment unit on a basis of a determination result of the correlation determination unit.

11. A non-transitory computer-readable storage medium, wherein the computer-readable storage medium including a program that causes a computer to perform a signal processing method, the signal processing method comprising:
causing a first gain adjustment unit included in a first panel displacement control unit to which a first audio signal is input to adjust a level of the first audio signal;
causing a second gain adjustment unit included in a second panel displacement control unit to which a second audio signal is input to adjust a level of the second audio signal;
causing a correlation determination unit included in a control unit to determine presence or absence of a correlation between the first audio signal and the second audio signal; and
causing a gain control unit included in the control unit to control a level adjustment amount in each of the first gain adjustment unit and the second gain adjustment unit on a basis of a determination result of the correlation determination unit.

12. A video display device comprising:
a first video display panel;
a first vibrator configured to vibrate the first video display panel;
a second video display panel disposed at a position adjacent to the first video display panel;
a second vibrator configured to vibrate the second video display panel;
a first panel displacement control unit to which a first audio signal is input;
a second panel displacement control unit to which a second audio signal is input; and
a control unit configured to control the first panel displacement control unit and the second panel displacement control unit, wherein
the first panel displacement control unit includes a first gain adjustment unit configured to adjust a level of the first audio signal,
the second panel displacement control unit includes a second gain adjustment unit configured to adjust a level of the second audio signal, and
the control unit includes
a correlation determination unit configured to determine presence or absence of a correlation between the first audio signal and the second audio signal, and
a gain control unit configured to control a level adjustment amount in each of the first gain adjustment unit and the second gain adjustment unit on a basis of a determination result of the correlation determination unit.

* * * * *